United States Patent
Bolding et al.

(10) Patent No.: US 6,832,181 B1
(45) Date of Patent: Dec. 14, 2004

(54) METHOD TO DISTINGUISH BETWEEN PHYSICAL HARDWARE AND SIMULATED HARDWARE

(75) Inventors: Joe D. Bolding, Allen, TX (US); Daniel G. Tormey, Richardson, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 778 days.

(21) Appl. No.: 09/706,095

(22) Filed: Nov. 3, 2000

(51) Int. Cl.[7] .................................................. G06G 7/62
(52) U.S. Cl. .............................. 703/13; 703/21; 703/22
(58) Field of Search ............................. 703/13, 21, 22, 703/23, 14; 711/173

(56) References Cited

U.S. PATENT DOCUMENTS

| | | | | |
|---|---|---|---|---|
| 5,574,854 A | * | 11/1996 | Blake et al. ................... | 714/28 |
| 6,363,509 B1 | * | 3/2002 | Parulkar et al. ............. | 714/738 |
| 6,490,545 B1 | * | 12/2002 | Peng ........................... | 703/13 |
| 6,532,573 B1 | * | 3/2003 | Kurosaka ....................... | 716/5 |

* cited by examiner

*Primary Examiner*—Albert W. Paladini

(57) ABSTRACT

Simulated computer hardware is differentiated from physical computer hardware for user code by detecting a sequence of instructions which produce no effect on physical computer hardware but which set a flag on simulated computer hardware. User code may thus issue the sequence of instructions, then check the flag to determine whether it is executing on simulated hardware or physical hardware.

22 Claims, 2 Drawing Sheets

METHOD TO DISTINGUISH BETWEEN PHYSICAL HARDWARE AND SIMULATED HARDWARE

FIELD OF THE INVENTION

This invention relates to software simulation of computer hardware and more specifically to a method for user code to distinguish whether it is executing on physical hardware or simulated hardware.

BACKGROUND

Architectural simulators are used primarily during the development of a new computer platform to simulate the physical hardware which is being designed. This allows software developers to begin creating programs for the new computer platform even before the hardware development has been completed. Architectural simulators allow software to be programmed and debugged so that it is ready to release with the completed computer platform.

The software, or user code, being programmed and tested is executed on the architectural simulator during hardware development. Once the physical hardware has been manufactured, the user code can be executed either on the physical hardware or the simulated hardware. The user code should preferably execute exactly the same way and produce the same results on either the simulated hardware or the physical hardware. It is therefore preferable to execute the same user code on both the simulated hardware and the physical hardware. However, since simulated hardware and physical hardware is not exactly the same, there are certain instances in which the user code needs to be execute differently depending upon whether it is executing in simulated hardware or physical hardware.

For example, simulated hardware almost always executes user code more slowly than physical hardware, since the simulated hardware is actually simulator code being executed on an existing computer system. The existing computer system is thus required to read the user code instructions, execute the simulator code to translate the user code instructions into instructions which are native to the existing computer system, then execute the native instructions. In contrast, physical hardware executing the same user code is only required to read the user code instructions and execute them. Therefore, the execution speed is almost never the same on the simulated hardware and the physical hardware. This becomes a problem when critical timing paths in the user code rely on execution speed, such as when a software timing loop operates by counting instructions. In this case, the user code must know how many instructions per second are executed by the simulated or physical hardware.

This type of problem is addressed in typical user code by including two alternate sections of code, one to be executed on simulated hardware and one to be executed on physical hardware, with conditional compilation flags in the code which include only one of the alternate sections in the compiled software. For example, if the user code is written in a high level language, such as C, it must be compiled into instructions which are part of the instruction set for the platform being designed. Compilation flags can be used to instruct the compiler to include or exclude portions of the user code in the compiled executable program. This allows the user code to be maintained in one location, regardless of whether it will be executed on simulated or physical hardware. The main portions of the user code which are hardware independent can be executed on either type, and hardware dependent sections are compiled according to the conditional compilation flags.

Unfortunately, this approach does have drawbacks. The programmer must modify the user code to indicate which of the alternate sections to include in the compiled executable program. In addition, two separate executable programs are created, one for simulated hardware and one for physical hardware. This doubles the storage space required for the user code and introduces the risk of using the wrong user code for the target hardware type.

SUMMARY

To assist in achieving the aforementioned needs, the inventors have devised a method which allows user code to distinguish whether it is executing on physical hardware or simulated hardware. A single version of the user code may therefore be maintained which detects whether it is executing on simulated hardware or physical hardware and function accordingly, possibly with different code paths. In a preferred embodiment, simulated computer hardware is differentiated from physical computer hardware by the hardware simulator detecting a sequence of instructions issued by the user code which produce no effect on physical computer hardware and setting a flag. User code may thus issue the sequence of instructions, then check the flag to determine whether it is executing on simulated hardware or physical hardware. To minimize the likelihood that the sequence of instructions is accidentally produced by the user code, the sequence is preferably executed with no intervening instructions, including those in traps or interrupt handlers. The sequence is also preferably executed by a single processor in the simulator and contains exact predetermined parameter values in the proper order.

Thus, the invention may comprise a method of determining whether an electronic device is simulated. The method includes storing a first value in a memory location, then executing at least one operation on the electronic device. The at least one operation causes the memory location to change value only if the computer platform is simulated. The method also includes reading a second value from the memory location to determine whether the second value is different from the first value.

The invention may also comprise a method of indicating that an electronic device is a simulation, including comparing instructions for the electronic device with a predetermined sequence of instructions, and indicating that the electronic device is a simulation if the instructions include the predetermined sequence of instructions.

The invention may also comprise a computer hardware simulator having at least one computer readable storage medium containing computer readable program code. The computer readable program code includes code for receiving instructions for the computer hardware, code for comparing the instructions with a predetermined set of instructions, and code for setting a flag if the instructions contain the predetermined set of instructions. The flag indicates that the computer hardware is simulated rather than physical.

The invention may also comprise a computer hardware simulator having means for receiving an instruction sequence, means for comparing the instruction sequence with a predetermined instruction sequence, and means for indicating that the computer hardware is a simulation if the instruction sequence matches the predetermined instruction sequence.

BRIEF DESCRIPTION OF THE DRAWING

Illustrative and presently preferred embodiments of the invention are shown in the accompanying drawing, in which.

DESCRIPTION OF THE PREFERRED EMBODIMENT

Figure 1:
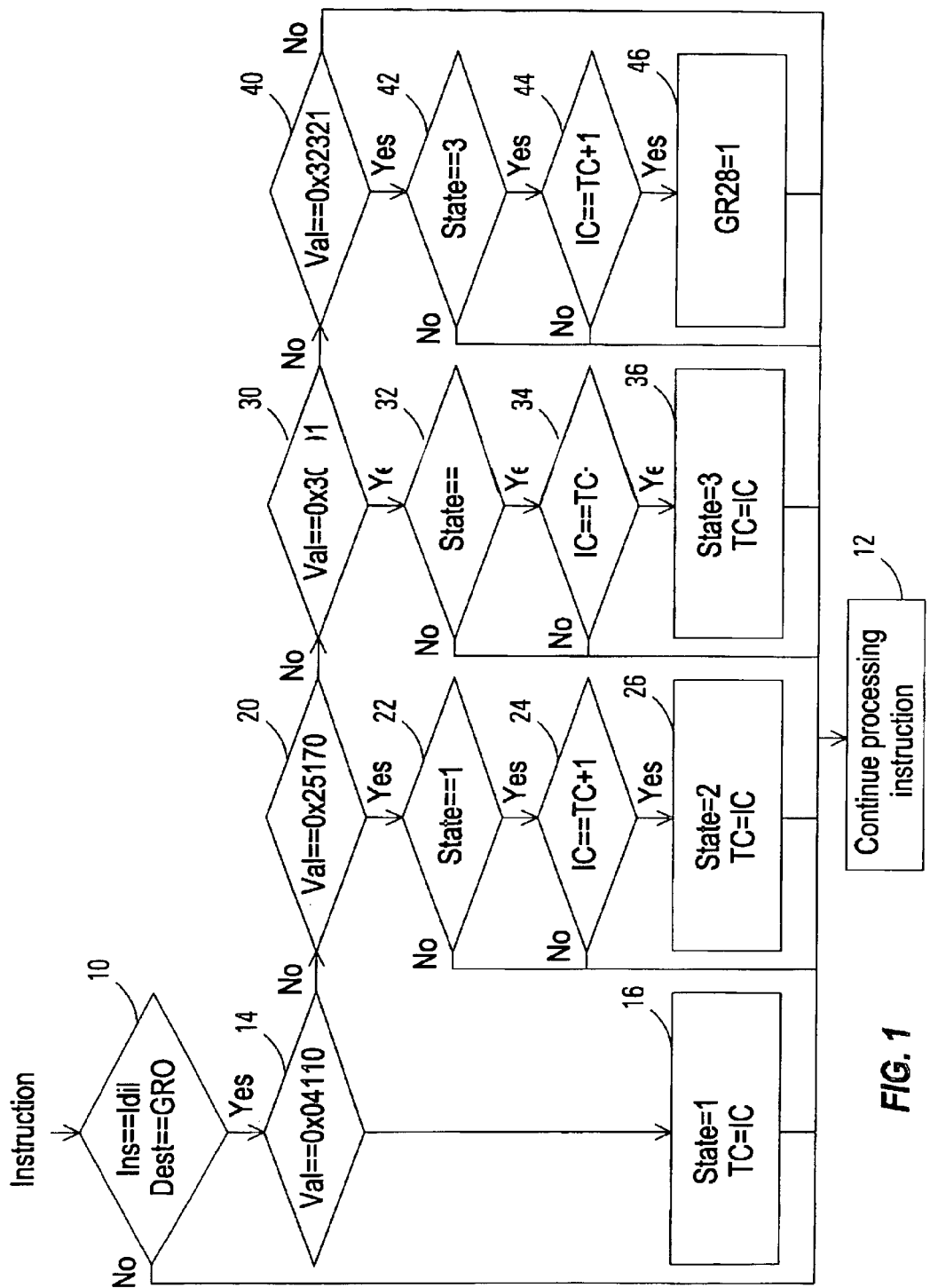
FIG. 1 is a flow chart illustrating how the ldil instruction is processed to allow user code to distinguish between physical hardware and simulated hardware for computer platforms in which ldil instructions directed to general register 0 are null operations.

The drawing and description, in general, disclose a method of determining whether an electronic device is simulated. The method includes storing a first value in a memory location, then executing at least one operation on the electronic device. The at least one operation causes the memory location to change value only if the electronic device is simulated. The method also includes reading a second value from the memory location to determine whether the second value is different from the first value.

The drawing and description also disclose a method of indicating that an electronic device is a simulation, including comparing instructions for the electronic device with a predetermined sequence of instructions, and indicating that the electronic device is a simulation if the instructions include the predetermined sequence of instructions.

The drawing and description also disclose a computer hardware simulator having at least one computer readable storage medium containing computer readable program code. The computer readable program code includes code for receiving instructions for the computer hardware, code for comparing the instructions with a predetermined set of instructions, and code for setting a flag if the instructions contain the predetermined set of instructions. The flag indicates that the computer hardware is simulated rather than physical.

The drawing and description also disclose a computer hardware simulator having means for receiving an instruction sequence, means for comparing the instruction sequence with a predetermined instruction sequence, and means for indicating that the computer hardware is a simulation if the instruction sequence matches the predetermined instruction sequence.

The method to distinguish between physical hardware and simulated hardware allows programmers of user code to maintain one version of code for both physical and simulated hardware. The user code is therefore able to determine whether it is being executed on a simulated electronic device, e.g. an architectural simulator, or on a physical electronic device, e.g. a physical computer. This prevents the need to include conditional compilation flags in the code which result in multiple compiled executable programs. The user code may include different code paths depending upon whether it is executing on simulated or physical hardware. The user code may also use the information to initialize constants in the code, such as the number of instructions per second the computer executes, which would make timing loops operate properly whether on simulated or physical hardware.

The method to distinguish between physical hardware and simulated hardware detects whether an electronic device, e.g. a computer, exists physically or as a software simulation such as an architectural simulator. This method is applicable to any electronic device which processes instructions and which may be simulated. Several non-limiting exemplary embodiments will be discussed hereinafter, directed at different electronic devices. However, the method to distinguish between physical hardware and simulated hardware should not be viewed as limited to any particular electronic device discussed herein.

In a preferred embodiment, the method to distinguish between physical hardware and simulated hardware is adapted to distinguish between a physical and a simulated computer platform. Computers are layered devices having a chip-level hardware layer, a firmware and operating system layer, and an applications program layer. The chip-level hardware layer is referred to as a computer platform. In the preferred embodiment, the architectural simulator simulates a computer platform. However, the architectural simulator may also simulate any or all layers of a computer.

An architectural simulator consists of a computer program, or simulator code, which is executed on an existing computer. For example, the simulator code may be executed on a commercially available computer such as a Unix workstation. The architectural simulator is used to execute user code. Thus, an existing computer system executes the simulator code, which in turn executes the user code.

Preferably, the method to distinguish between physical hardware and simulated hardware is adapted to electronic devices which include at least one type of instruction which has no effect when executed on physical hardware, in other words, a null operation. For example, PA-RISC 2.0 computer processors ignore the load immediate left (ldil) instruction when it is directed at general register (GR) zero. The architectural simulator which simulates the physical hardware is programmed with a simulator identification function to detect the instruction issued by user code and to indicate that it is simulated hardware.

Note that the instruction used to distinguish between physical and simulated hardware does not have to cause a null operation. However, selecting a null operation instruction ensures that user code executing on physical hardware will not cause problems by issuing the instruction. With care in designing user code, the method to distinguish between physical hardware and simulated hardware may be applied even to electronic devices which have no null operation instructions.

The simulator identification function indicates to user code that it is executing on simulator hardware by setting a "simulated" flag which can be read by the user code. This flag is preferably stored in memory so that it appears to be a normal return value from a function. Typically, functions return values to user code by storing the return values in general registers in the processor. However, general registers are used repeatedly for various purposes during execution of user code, so it is important not to change the value in a general register unless the user code is aware that it might change. For example, if another function in the user code is using the return value general register and the simulator identification function is accidentally triggered, the return value general register will be overwritten and the first function will produce the wrong result. These types of failures, or bugs, in the user code can be extremely difficult to identify and correct, and can cause the user code to crash.

The instruction issued to trigger the simulator identification function may be a single instruction, a sequence of a single type of instructions, or a sequence of different types of instructions, depending upon which instructions are treated as null operations by the computer platform being simulated. However, even when a single instruction can be used as a null operation, it is preferable to require a sequence of instructions to minimize the risk of accidentally triggering the simulator identification function. To further minimize the likelihood of accidentally triggering the simulator identification function, the user code can be required to issue the sequence of instructions in a proper order with no pauses or interruptions. For example, if any other instruction is issued during the sequence, including by interrupt handlers or traps, the simulator identification function will not set the "simulated" flag.

The instructions may also be followed by parameters or numbers to reduce the risk of accidentally triggering the simulator identification function. For example, a nop instruction on a 64 bit Intel® processor may be followed by a parameter which is normally ignored by the processor. The instruction sequence must also be issued by a single processor.

A preferred embodiment of the method to distinguish between physical hardware and simulated hardware will now be described in detail. In this embodiment, the hardware platform being simulated includes a PA-RISC 2.0 computer processor. On this processor, general register 28 is used to return values from functions. General register (GR) 0 is used to rapidly retrieve a zero constant. Certain types of write operations to GR 0 have no effect, therefore compilers and assemblers don't normally generate instructions for these write operations. For example, a load immediate left (ldil) write operation to GR 0 is a null operation. Therefore, the simulator identification function in this embodiment detects ldil operations directed at GR 0, and returns the results in GR 28. To minimize the risk of accidentally triggering the simulator identification function, four ldil operations directed at GR 0 must be executed, each with predetermined parameters in the proper order with no interruptions. These predetermined parameters may be arbitrarily selected, or may be selected to minimize the probability that they will be accidentally executed.

The user code algorithm triggering the simulator identification function is preferably written in the Assembly computer programming language, although the simulator identification function may be written in any programming language. The Assembly language is a low level programming language which offers the programmer a great deal of control over the compiled (or assembled) executable program. Alternatively, the user code algorithm triggering the simulator identification function may be written in a high level programming language such as 'C'. However, it is much more difficult to ensure that the compiler for the high level programming language will actually create the required null operation instructions in the compiled executable program.

Following is the user code algorithm, the "isSim" function, which triggers the simulator identification function and which can be called whenever desired within user code software programs:

```
1    isSim_Fv            .export isSim_Fv,ENTRY
2    isSim               .export isSim,ENTRY
3    ldi                 0, %r28
4    ldil                0x04110, %r0
5    ldil                0x25170, %r0
6    ldil                0x30291, %r0
7    ldil                0x32321, %r0
8    ; on simulator, GR28 now contains a 1
9    bv   (%r2)
10   nop
```

The isSim function preloads the value 0 to GR 28, then issues a series of four ldil write instructions directed at GR 0. The simulator identification function detects these instructions and stores the value 1 in GR 28 so that user code calling the isSim function will receive a return value of 1 if the code is being executed on simulated hardware. (If the code is being executed on physical hardware, the simulator identification function does not exist and the processor ignores the ldil write instructions directed at GR 0. The return value in GR 28 on physical hardware remains 0.)

Lines 1 and 2 of the isSim function provide an entry point so that user code can call the function. Line 1 is designed to be called by user code written in the C++ programming language, while line 2 is designed to be called by user code written in the Assembly language. (The "_Fv" is added to the function name to support the C++ name mangling feature.)

Line 3 of the isSim function issues the load immediate (ldi) instruction to preload GR 28, the return value register, with the value 0 (generally treated as the value FALSE). Lines 4–7 issue the ldil instruction to write the numbers 4110, 25170, 30291, and 32321 to GR 0 in order and with no interruptions. (Note that the contents of GR 0 will not change either on simulated or physical hardware, since the ldil instruction directed toward GR 0 is a null operation.) If the code is executing on simulated hardware, the sequence of ldil instructions will have triggered the simulator identification function at this point, and GR 28 will have been overwritten with the value 1 (generally treated as the value TRUE). Thus, if isSim is executing on simulated hardware, the function returns the value TRUE, and if it is executing on physical hardware, the function returns the value FALSE.

Lines 9 and 10 terminate the isSim function, returning to the user code which called the isSim function. Line 9 issues the branch vector instruction to the address located in GR 2, which contains the address of the instruction in the user code after that which called the isSim function. Line 10 issues the nop instruction since PA_RISC 2.0 processors execute the instruction immediately following a branch instruction.

If the isSim function above is linked with other user code, the user code in C or C++ can call the isSim function with instructions such as:

```
if (isSim( ))
{
    /* simulator specific code */
}
else
{
    /* hardware specific code */
}
```

User code designed to run on simulated hardware is located in the simulator specific code area, and user code designed to run on physical hardware is located in the hardware specific code area.

Referring now to FIG. 1, the simulator identification function triggered by the isSim function will be described. FIG. 1 contains a flow chart for processing instructions issued by the user code. When an instruction is received from the user code, it is first checked 10 to see whether it is the ldil instruction and In whether it is directed at GR 0. (The double equals signs "=="in the flow chart text indicate comparisons, while single equals signs "=" in the flow chart text indicate assignments.) If the instruction is not the ldil instruction or if it is not directed at GR 0, normal processing continues 12 on the instruction.

If the instruction is ldil directed at GR 0, the value of the parameter following the ldil operator is compared 14 with 4110, the first required number of the simulator identification function sequence. (The parameters required are arbitrarily predetermined.) If the parameter is 4110, a state variable "State" is set 16 to 1, and an instruction counter storage variable "TC" is set to the contents of the simulator instruction counter (IC). Normal processing in the simulator then continues 12.

The simulator instruction counter is incremented by one each time the simulator executes an instruction, while the instruction counter in physical hardware is incremented by at least one each time an instruction is executed. The contents of the instruction counter are stored in the TC variable to ensure that the simulator identification instruction sequence is issued with no interruptions. That is, the four ldil instructions with the appropriate parameters directed at GR 0 must be received with the instruction counter containing four successive values, such as 44, 45, 46, and 47.

The next time an instruction is received, it is checked 10 to see if it is the ldil instruction directed at GR 0, and the value of the parameter is compared 14 with 4110. If the parameter is again 4110, the instruction sequence was not correctly received the first time. However, since 4110 is the first required parameter, the sequence has been restarted. Therefore, State will again be set 16 to 1, and TC will be reset with the current contents of the simulator instruction counter, resetting the simulator identification function. Normal processing in the simulator then continues 12. If the parameter is not 4110, it is then compared 20 with the number 25170, the second number required in the instruction sequence for the simulator identification function.

If the parameter is 25170, the State variable is checked 22 to see if it is in state 1. If not, the parameter 25170 was received at the incorrect time, and processing continues 12. If the simulator identification function is in state 1, the instruction counter (IC) is checked 24 to see if it is equal to the contents of TC+1. In other words, the instruction counter is checked to see if any intervening instructions have been executed since the last correct parameter to the ldil instruction was received. If any intervening instructions were executed, normal processing continues 12 and the simulator identification function will not progress further unless it is restarted. If IC is equal to TC+1, State is set 26 to 2 and the current IC is again stored in TC, and normal processing continues 12.

The next time an instruction is received, it is checked 10 to see if it is the ldil instruction directed IF at GR 0, and the value of the parameter is compared 14 with 4110. If it not 4110, the parameter is compared 20 with 25170. If it is not 25170, the parameter is then compared 30 with 30291, the third number required in the instruction sequence for the simulator identification function. If the parameter is 30291, the State variable is checked 32 to see if it is in state 2. If not, the parameter 30291 was received at the incorrect time, and processing continues 12. If State is 2, IC is checked 34 to see if it is equal to the contents of TC+1. If not, normal processing continues 12. If IC is equal to TC+1, State is set 36 to 2 and the current IC is again stored in TC, and normal processing continues 12.

The next time an instruction is received, it is checked 10 to see if it is the ldil instruction directed at GR 0, and the value of the parameter is compared 14 with 4110. If it not 4110, the parameter is compared 20 with 25170. If it is not 25170, the parameter is compared 30 with 30291. If it is not 30291, the parameter is compared 40 with 32321, the fourth number required in the instruction sequence for the simulator identification function. If the parameter is 32321, the State variable is checked 42 to see if it is in state 3. If not, the parameter 32321 was received at the incorrect time, and processing continues 12. If State is 3, IC is checked 44 to see if it is equal to the contents of TC+1. If not, normal processing continues 12. If IC is equal to TC+1, the correct instruction sequence with the proper parameters was received in order without interruptions, and the value 1 (True) is stored in GR 28. The user code function isSim which issued the instruction sequence will then return, and the user code which called isSim can check the value of GR 28 to see whether it is executing on simulated or physical hardware.

Sample simulator code implementing the simulator identification function of FIG. 1 will now be discussed. However, it is important to note that skilled programmers will be able to adapt the algorithms discussed herein in many ways without departing from the inventive concepts disclosed herein.

The simulator identification function in this preferred embodiment is located in the ldil function code of the architectural simulator.

```
int ldil (u32 WhichGR, u32 val)
{
    if (WhichGr)
        gr[WhichGr] = val;
    else
    {
        if (val == 0x04110)
        {
            State = 1;
            TC = IC;
        }
        else if (val == 0x25170 && State == 1)
            if (++TC == IC)
                State = 2;
        else if (val == 0x30291 && State == 2)
            if (++TC == IC)
                State = 3;
        else if (val == 0x32321 && State == 3)
            if (++TC == IC)
                gr[28] = 1;
    }
    return 0;
}
```

The ldil function above first checks to see whether it is directed at a register other than GR 0, and if so, it stores the parameter "val" in the specified register. If it is directed at GR 0, the rest of the ldil function above implements the flow chart of FIG. 1 discussed above.

The ldil function above inherently requires that the instruction sequence be issued by a single processor, since each processor has its own instruction counter and general registers. Therefore, because each processor is preferably modeled independently, there is no risk of different processors in a multi-processor system accidentally triggering each others simulator identification function.

Figure 2:
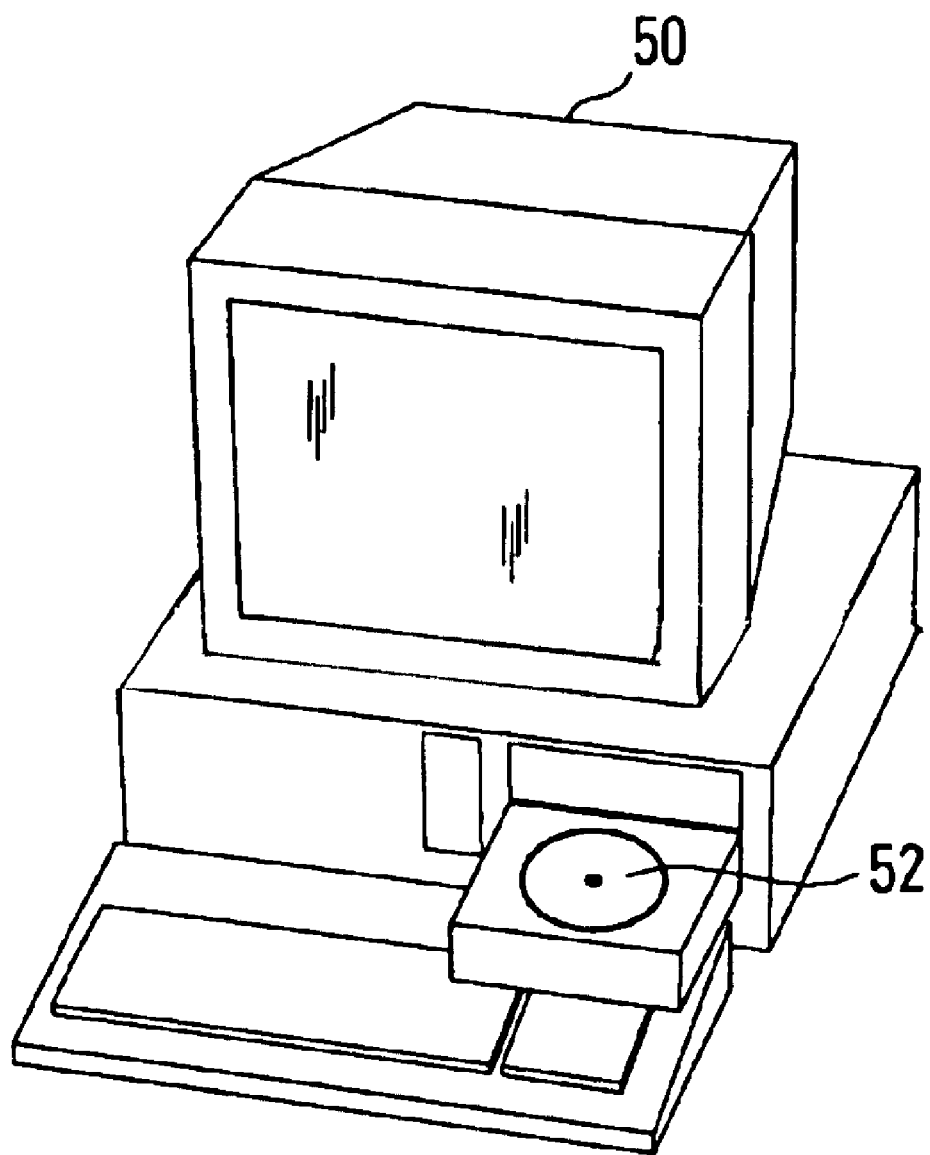
FIG. 2 illustrates a computer suitable for executing an architectural simulator.

FIG. 2 illustrates a computer 50 which may be used to execute an architectural simulator. The program code for the architectural simulator may be distributed on removable media such as a CD-ROM 52.

In a second preferred embodiment, the method to distinguish between physical hardware and simulated hardware is adapted for Intel® 64 bit processors. These processors allow parameters to follow nop instructions, and GR 8 is used to return values from functions. In this embodiment, the isSim function would appear as follows, followed by a return instruction:

| | | |
|---|---|---|
| 1 | isSim_Fv | .export isSim_Fv,ENTRY |
| 2 | isSim | .export isSim,ENTRY |
| 3 | ldi | 0, %r8 |
| 4 | nop | 0x04110 |
| 5 | nop | 0x25170 |
| 6 | nop | 0x30291 |
| 7 | nop | 0x32321 |
| 8 | ; on simulator, GR8 now contains a 1 | |

The only changes to the flow chart of FIG. 1 in this embodiment are that the first comparison 10 would look for a nop instruction followed by a parameter, and that the result would be stored 46 in GR 8 instead of GR 28. The simulator identification function implementing this modified flow chart would be included in the nop function of the architectural simulator.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method of determining whether an electronic device is simulated, comprising:

storing a first value in a memory location;

executing at least one operation on said electronic device wherein said at least one operation causes said memory location to change value if said electronic device is simulated and wherein said at least one operation does not cause said memory location to change value if said electronic device is not simulated; and reading a second value from said memory location to determine whether said second value is different from said first value.

2. The method of claim 1, wherein said electronic device comprises a computer.

3. The method of claim 1, wherein said memory location comprises a register.

4. The method of claim 3, wherein said register comprises general register 0.

5. The method of claim 3, wherein said register comprises a return register.

6. The method of claim 1, wherein said at least one operation comprises a ldil operation.

7. The method of claim 1, wherein said at least one operation comprises at least one nop operation.

8. The method of claim 7, wherein each of said at least one nop operation is followed by a parameter.

9. A method of indicating to program code that it is executed on simulated hardware, comprising:

said simulated hardware reading software instructions from said program code to be executed;

said simulated hardware comparing said software instructions with a predetermined sequence of instructions; and said simulated hardware setting a flag indicating that program code is executing on simulated hardware if said software instructions include said predetermined sequence of instructions, wherein said predetermined sequence of instructions, if executed on physical hardware rather than simulated hardware, would not set said flag.

10. The method of claim 9, wherein said simulator hardware comprises a simulated computer.

11. The method of claim 9, wherein setting said flag comprises storing a value in a memory location.

12. The method of claim 9, wherein said flag is set only if said predetermined sequence of instructions in said software instructions are not interrupted by another instruction.

13. The method of claim 9, wherein said predetermined sequence of instructions comprises at least one operator and parameter.

14. The method of claim 13, wherein said at least one operator and parameter comprises at least one ldil operator and a predetermined number.

15. The method of claim 13, wherein said at least one operator and parameter comprises at least one nop operator and a predetermined number.

16. The method of claim 9, wherein said predetermined sequence of instructions comprises a sequence of null operations.

17. A computer hardware simulator, comprising:

a) at least one computer readable storage medium; and b) computer readable program code stored in the at least one computer readable storage medium, the computer readable program code comprising:

i) code for receiving instructions written to be executed by computer hardware or by said computer hardware simulator which simulates said computer hardware;

ii) code for comparing said instructions with a predetermined set of instructions; and iii) code for setting a flag if said instructions contain said predetermined set of instructions, wherein said flag indicates that said instructions are executing on said computer hardware simulator rather than said computer hardware.

18. The computer hardware simulator of claim 17, wherein said flag comprises a predetermined value stored in a register.

19. The computer hardware simulator of claim 17, wherein said predetermined set of instructions must be included in said instructions in order with no other intervening instructions before setting said flag.

20. The computer hardware simulator of claim 17, wherein said predetermined set of instructions comprises a plurality of ldil operations storing predetermined values to general register 0.

21. The computer hardware simulator of claim 17, wherein said predetermined set of instructions comprises a plurality of nop operations with predetermined parameters.

22. A computer hardware simulator, comprising:

means for receiving an instruction sequence; means for comparing said instruction sequence with a predetermined instruction sequence; and means for indicating that said computer hardware is a simulation if said instruction sequence matches said predetermined instruction sequence.

* * * * *